US008582378B1

(12) United States Patent
Chuang et al.

(10) Patent No.: US 8,582,378 B1
(45) Date of Patent: Nov. 12, 2013

(54) THRESHOLD VOLTAGE MEASUREMENT DEVICE

(75) Inventors: Ching-Te Chuang, New Taipei (TW);
Shyh-Jye Jou, Hsinchu County (TW);
Geng-Cing Lin, Taipei (TW);
Shao-Cheng Wang, Kaohsiung (TW);
Yi-Wei Lin, New Taipei (TW);
Ming-Chien Tsai, Kaohsiung (TW);
Wei-Chiang Shih, Taipei (TW);
Nan-Chun Lien, Taipei (TW); Kuen-Di Lee, Kinmen County (TW); Jyun-Kai Chu, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/597,733

(22) Filed: Aug. 29, 2012

(30) Foreign Application Priority Data

May 11, 2012 (TW) .............................. 101116911 A

(51) Int. Cl.
G11C 7/00 (2006.01)
G11C 29/00 (2006.01)

(52) U.S. Cl.
USPC ....... 365/201; 365/154; 714/721; 324/762.01

(58) Field of Classification Search
USPC .................... 365/154, 156, 201; 714/721; 324/762.01, 762.09
See application file for complete search history.

(56) References Cited

U.S. PATENT DOCUMENTS

| 6,552,941 | B2 * | 4/2003 | Wong et al. .................... 365/201 |
| 7,508,697 | B1 | 3/2009 | Mukhopadhyay et al. |
| 7,679,978 | B1 * | 3/2010 | Su et al. ......................... 365/201 |
| 7,868,606 | B2 | 1/2011 | Meterelliyoz et al. |
| 7,936,623 | B2 * | 5/2011 | Deng et al. .................... 365/201 |
| 2009/0190413 | A1 | 7/2009 | Hsu et al. |
| 2013/0223136 | A1 * | 8/2013 | Chuang et al. ................ 365/154 |

OTHER PUBLICATIONS

Lin G.-C., Wang S.-C., Lin Y.-W., Lien N.-C., Shih W.-C., Tsai M.-C., Chuang C.-T., Jou S.-J., Lee K.-D., Chu, J.-K., "An All-Digital Bit Transistor Characterization Scheme for CMOS 6T SRAM Array", Department of Electronics Engineering, National Chiao Tung University, Hsinchu, Taiwan, R.O.C., Date of Conference: May 20-23, 2012 Publication Year: 2012, pp. 2485-2488.
Brain L.Ji, Dale J. Pearson, Issac Lauer, Franco Stellari, David J. Frank, Leland Chang, and Mark B. Ketchen"Operational Amplifier Based Test Structure for Transistor Threshold Voltage Variation", 2008 IEEE Conference on Microelectronic Test Structures, Mar. 24-27, Edinburgh, UK, pp. 3-7.

(Continued)

Primary Examiner — Harry W Byrne
Assistant Examiner — Lance Reidlinger
(74) Attorney, Agent, or Firm — Muncy, Geissler, Olds & Lowe, PLLC

(57) ABSTRACT

A threshold voltage measurement device is disclosed. The device is coupled to a 6T SRAM. The SRAM comprises two inverters each coupled to a FET. Power terminals of one inverter are in a floating state; the drain and source of the FET coupled to the inverter are short-circuited. Two voltage selectors, a resistor, an amplifier and the SRAM are connected in a negative feedback way. Different bias voltages are applied to the SRAM for measuring threshold voltages of two FETs of the other inverter and the FET coupled to the other inverter. The present invention uses a single circuit to measure the threshold voltages of the three FETs without changing the physical structure of the SRAM. Thereby is accelerated the measurement and decreased the cost of the fabrication process and measurement instruments.

10 Claims, 5 Drawing Sheets

(56) References Cited

OTHER PUBLICATIONS

Khellah, M., Khalil, D.E., Somasekhar, D., Ismail, Y., Karnik, T., De, V, "Effect of Power Supply Noise on SRAM Dynamic Stability", Symposium on VLSI Circuits Digest of Technical Papers, Date of Conference: Jun. 14-16, 2007., Publication Year: 2007, pp. 76-77.

Fischer, T., Amirante, E., Hofmann, K., Ostermayr, M., Huber, P., Schmitt-Landsiedel, D., "A 65nm test structure for the analysis of NBTI induced statistical variation in SRAM transistors", Date of Conference: Sep. 15-19, 2008, pp. 51-54.

Xiaowei Deng, Wah Kit Loh, Pious, B., Houston, T.W., Liu, L., Bashar Khan, Corum, D., "Characterization of Bit Transistors in a Functional SRAM", 2008 Symposium on VLSI Circuits Digest of Technical Papers, Date of Conference: Jun. 18-20, 2008, pp. 44-45.

* cited by examiner

THRESHOLD VOLTAGE MEASUREMENT DEVICE

BACKGROUND OF THE INVENTION

1. Field of the Invention

The present invention relates to a voltage measurement device, particularly to a threshold voltage measurement device.

2. Description of the Related Art

Variability is a critical problem in the systematic design of VLSI (Very Large Scale Integrated) circuits and likely to affect the threshold voltage of transistors. Threshold voltage correlates closely with performance, stability and reliability of electronic elements. Therefore, threshold voltage is an important index of variability and able to reflect the severity of the related phenomena and problems. Hence, it is necessary to create a circuit architecture for measuring threshold voltages of transistors, whereby data can be collected fast and massively to analyze threshold voltage variation and the influence of threshold voltage variation on the stability of chips.

Some prior arts use operational amplifiers to implement measurement of threshold voltages. Refer to FIG. 1 and FIG. 2. In FIG. 1, the output of an operational amplifier 10 connects with the gate of an N-channel FET (Field Effect Transistor) 12. The drain of the N-channel FET 12 connects with a high voltage. The source of the N-channel FET 12 connects with a low voltage via a resistor 14. The negative input of the operational amplifier 10 connects with the source of the N-channel FET 12. A preset voltage is supplied to the positive input of the operational amplifier 10. As the abovementioned connections implement a negative feedback circuit, the N-channel FET 12 generates a stable current. Thereby can be measured the threshold voltage of the N-channel FET 12. In FIG. 2, the output of an operational amplifier 16 connects with the gate of a P-channel FET 18. The drain of the P-channel FET 18 connects with a low voltage. The source of the P-channel FET 18 connects with a high voltage via a resistor 20. The negative input of the operational amplifier 16 connects with the source of the P-channel FET 18. A preset voltage is supplied to the positive input of the operational amplifier 16. As the abovementioned connections implement a negative feedback circuit, the P-channel FET 18 generates a stable current. Thereby can be measured the threshold voltage of the P-channel FET 18. Although the abovementioned measurement method can obtain the threshold voltage of a transistor, it does not apply to SRAM (Static Random Access Memory). Besides, the abovementioned method is economically inefficient because it needs expensive equipment and consumes much time but obtain only analog data.

In order to measure threshold voltage, some prior arts vary the physical structure of SRAM, including the polysilicon layer, the diffusion layer and the contact layer. Such a method would vary the physical characteristics and leakage current of SRAM, and causes SRAM to lose the advantages of the original physical structure.

Accordingly, the present invention proposes a threshold voltage measurement device to overcome the abovementioned problems.

SUMMARY OF THE INVENTION

The primary objective of the present invention is to provide a threshold voltage measurement device, which can use a single circuit structure to fast obtain the threshold voltages of the FETs of a 6T-SRAM without varying the physical structure of the 6T-SRAM, and which can further apply to the BTI (Bias Temperature Instability) technology to effectively shorten the time for measurement and greatly reduce the costs of fabrication and measurement.

In order to achieve the abovementioned objective, the present invention proposes a threshold voltage measurement device, which connects with a 6T-SRAM that comprises a first FET, a second FET, a third FET, an inverter, and a fourth FET. The first FET connects with a first bit line and a word line. The second FET and the third FET respectively have a first power terminal and a second power terminal. A third power terminal of the inverter and a fourth power terminal are in a floating state. The fourth FET connects with a second bit line and the word line. The drain and source of the fourth FET are short-circuited. The threshold voltage measurement device comprises an amplifier, a first voltage selector, and a second voltage selector. The negative input of the amplifier connects with the first bit line and connects with a power supply terminal via a resistor. The positive input of the amplifier connects with a preset positive voltage, whereby the amplifier outputs an amplified voltage. The amplifier connects with the first and second voltage selectors. The first voltage selector connects with the second bit line and receives a digital voltage. The first voltage selector selects the digital voltage or the amplified voltage and applies the selected voltage to the second bit line. The second voltage selector connects with the word line and receives a first high voltage. The second voltage selector selects the first high voltage or the amplified voltage and applies the selected voltage to the word line. For different measurement requirements, the threshold voltage measurement device operates according to a first operation mode, a second operation mode, or a third operation mode.

In the first operation mode, a second high voltage is applied to the first and second power terminals; the first voltage selector selects to apply the digital voltage to the second bit line; the second voltage selector selects to apply the amplified voltage to the word line; a first low voltage is applied to the power supply terminal to let the current value of the resistor under the voltage drop between the first low voltage and the preset positive voltage equal the current value of the first FET when a first gate-source voltage ($V_{GS1}$) of the first FET equals a first threshold voltage of the first FET, whereby a first current flows out from the first power terminal or the second power terminal and passes through the first FET and the resistor in sequence to the power supply terminal; while the voltage of the negative input equals the preset positive voltage, the first threshold voltage is obtained via the amplified voltage.

In the second operation mode, a third low voltage and the preset positive voltage are respectively applied to the first and second power terminals; the first voltage selector selects to apply the amplified voltage to the second bit line; the second voltage selector selects to apply the first high voltage to the word line; a fourth high voltage is applied to the power supply terminal to let the current value of the resistor under the voltage drop between the fourth high voltage and the preset positive voltage equal the current value of the second FET when a second gate-source voltage ($V_{GS2}$) of the second FET equals a second threshold voltage of the second FET, whereby a second current flows out from the power supply terminal and passes through the resistor, the first FET and the second FET in sequence to the first power terminal; while the voltage of the negative input equals the preset positive voltage, the second threshold voltage is obtained via the amplified voltage.

In the third operation mode, the preset positive voltage and a third high voltage are respectively applied to the first and second power terminals; the first voltage selector selects to apply the amplified voltage to the second bit line; the second voltage selector selects to apply the first high voltage to the word line; a second low voltage is applied to the power supply terminal to let the current value of the resistor under the voltage drop between the second low voltage and the preset positive voltage equal the current value of the third FET when a third gate-source voltage ($V_{GS3}$) of the third FET equals a third threshold voltage of the third FET, whereby a third current flows out from the second power terminal and passes through the third FET, the first FET and the resistor in sequence to the power supply terminal; while the voltage of the negative input equals the preset positive voltage, the third threshold voltage is obtained via the amplified voltage.

Below, embodiments are described in detail in cooperation with drawings to make easily understood the technical contents, characteristics and accomplishments of the present invention.

DETAILED DESCRIPTION OF THE INVENTION

Figure 1:
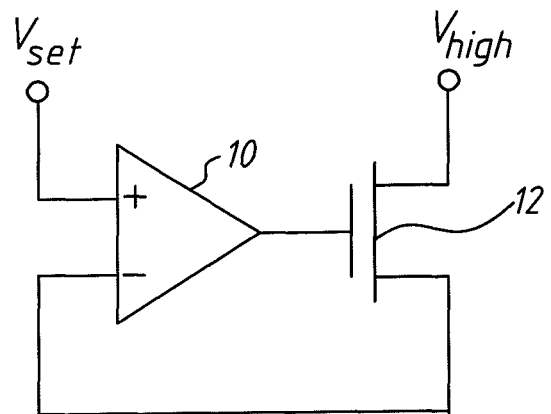
FIG. 1 schematically shows the circuit of a conventional threshold voltage measure device for an N-channel FET.
Figure 2:
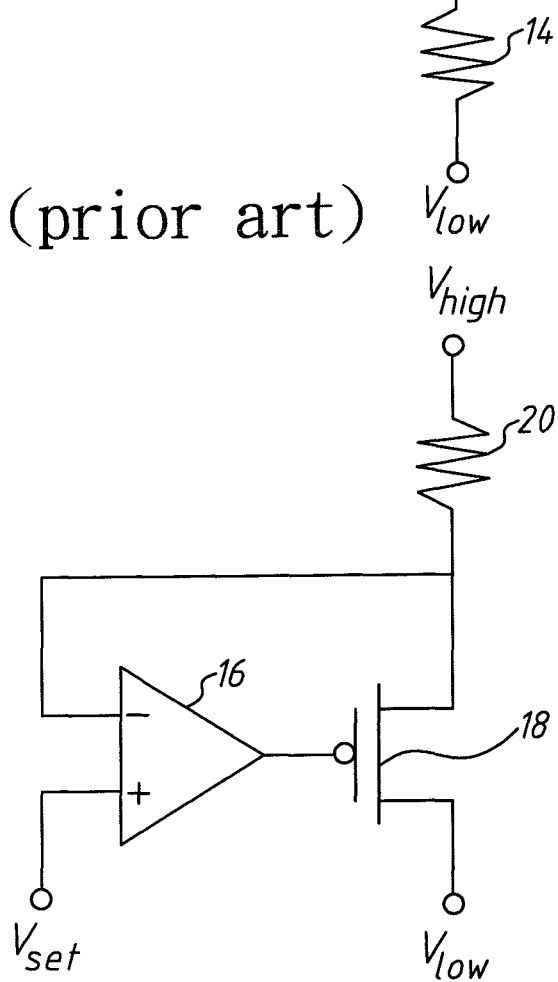
FIG. 2 schematically shows the circuit of a conventional threshold voltage measure device for a P-channel FET.
Figure 3:
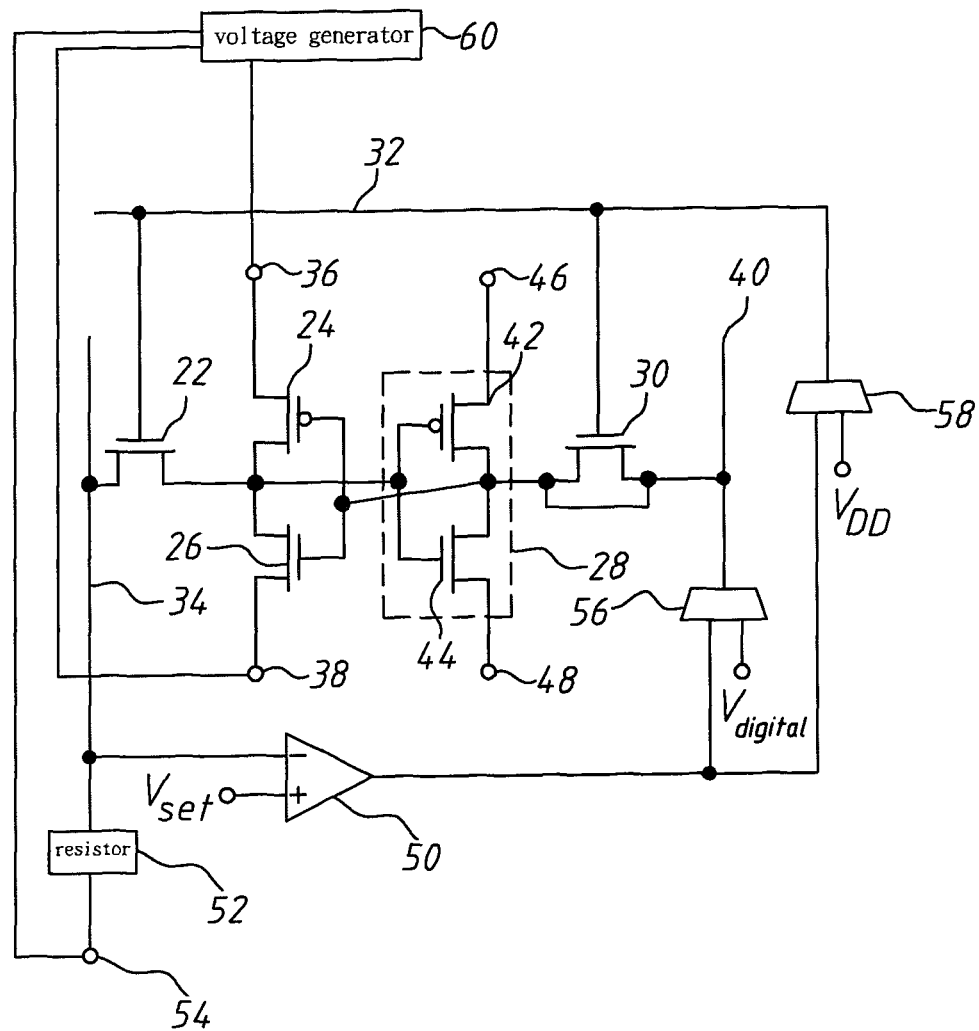
FIG. 3 schematically shows the circuit of a threshold voltage measure device according to one embodiment of the present invention.

Refer to FIG. 3. The threshold voltage measurement device of the present invention connects with a 6T SRAM that comprises a first FET 22, a second FET 24, a third FET 26, an inverter 28, and a fourth FET 30. The first, third and fourth FETs 22, 26 and 30 are N-channel FET. The second FET 24 is a P-channel FET.

The gate of the first FET 22 connects with a word line 32; the drain of the first FET 22 connects with a first bit line 34. The drain of the second FET 24 functions as a first power terminal 36; the source of the second FET 24 connects with the source of the first FET 22. The drain of the third FET 26 functions as a second power terminal 38; the source of the third FET 26 connects with the source of the first FET 22 and the inverter 28; the gate of the third FET 26 connects with the source of the first FET 22, the inverter 28, and the source of the fourth FET 30. The gate of the fourth FET 30 connects with the word line 32; the drain of the fourth FET 30 connects with a second bit line 40; the drain and source of the fourth FET 30 are short-circuited. The inverter 28 includes a fifth FET 42 and a sixth FET 44. The fifth FET 42 and the sixth FET 44 are respectively a P-channel FET and an N-channel FET. The drain of the fifth FET 42 functions as a third power terminal 46. The drain of the sixth FET 44 functions as a fourth power terminal 48. The third power terminal 46 and the fourth power terminal 48 are in a floating state. The source of the sixth FET 44 connects with the source of the fourth FET 30 and the gates of the second FET 24 and the third FET 26. The gate of the sixth FET 44 connects with the gate of the fifth FET 42 and the sources of the first, second and third FETs 22, 24 and 26. In the 6T SRAM, the third power terminal 46 and the fourth power terminal 48 are in a floating state, and the drain and source of the fourth FET 30 are short-circuited. The drain and source of the fourth FET 30 can be short-circuited via removing the vias of the third power terminal 46 and the fourth power terminal 48 and forming a metal layer on the drain and source of the fourth FET 30. Thereby, the threshold voltage can be measured without obviously varying the structure of the 6T SRAM.

The threshold voltage measurement device of the present invention comprises an amplifier 50, a first voltage selector 56, and a second voltage selector 58. The negative input of the amplifier 50 connects with the first bit line 34 and connects with a power supply terminal 54 via a resistor 52. The positive input of the amplifier 50 connects with a preset positive voltage $V_{set}$, whereby the amplifier 50 outputs an amplified voltage. The amplifier 50 connects with the first and second voltage selectors 56 and 58. The first voltage selector 56 connects with the second bit line 40 and receives a digital voltage $V_{digital}$. The first voltage selector 56 selects the digital voltage $V_{digital}$ or the amplified voltage and applies the selected voltage to the second bit line 40. The second voltage selector 58 connects with the word line 36 and receives a first high voltage $V_{DD}$. The second voltage selector 58 selects the first high voltage $V_{DD}$ or the amplified voltage and applies the selected voltage to the word line 36. For requirements of different measurements, the threshold voltage measurement device of the present invention operates according to a first operation mode, a second operation mode, or a third operation mode.

Figure 4:
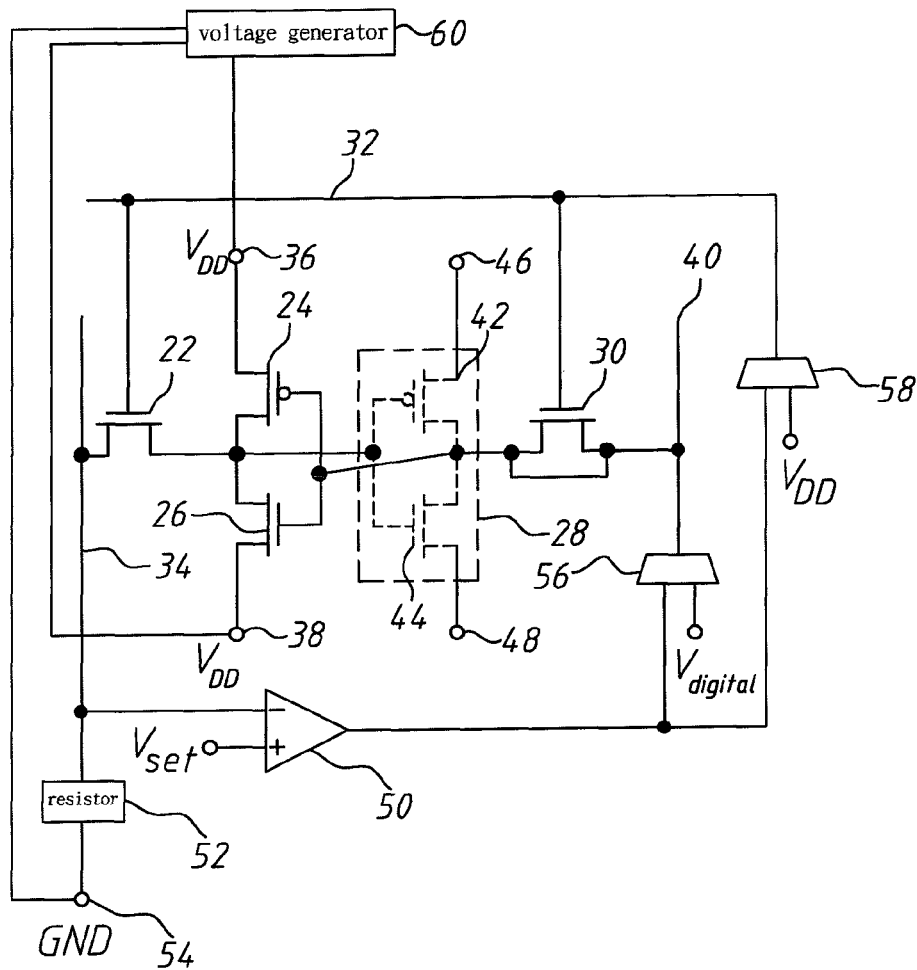
FIG. 4 schematically shows the circuit of a threshold voltage measure device for measuring the threshold voltage of a first FET according to one embodiment of the present invention.

Refer to FIG. 4, wherein the fifth and sixth FETs 42 and 44, which are drawn with dotted lines, do not operate because they are in a floating state. In the first operation mode, a voltage generator 60 applies a second high voltage $V_{DD}$ to the first and second power terminals 36 and 38. The first voltage selector 56 selects to apply the digital voltage $V_{digital}$ to the second bit line 40; the second voltage selector 58 selects to apply the amplified voltage to the word line 32. The voltage generator 60 applies a first low voltage GND to the power supply terminal 54 to let the current value of the resistor 52 under the voltage drop between the first low voltage GND and the preset positive voltage $V_{set}$ equal the current value of the first FET 22 when a first gate-source voltage $V_{GS1}$ of the first FET 22 equals a first threshold voltage of the first FET 22, whereby a first current flows out from the first power terminal 36 or the second power terminal 38 and passes through the first FET 22 and the resistor 52 in sequence to the power supply terminal 54. While the voltage of the negative input of the amplifier 50 equals the preset positive voltage $V_{set}$, the first threshold voltage is obtained via getting the amplified voltage output by the amplifier 50 at this time and taking the absolute value of the difference between the amplified voltage and the preset positive voltage $V_{set}$. For example, while the digital voltage $V_{digital}$ is a high level voltage, the first current flows out from the second power terminal 38 and passes through the third FET 26, the first FET 22 and the resistor 52 in sequence to the power supply terminal 54. While the voltage of the negative input of the amplifier 50 equals the preset positive voltage $V_{set}$, the first threshold voltage is obtained via getting the amplified voltage output by the amplifier 50 at this time and taking the absolute value of the difference between the amplified voltage and the preset positive voltage $V_{set}$. While the digital voltage $V_{digital}$ is a low level voltage, the first current flows out from the first power terminal 36 and passes through the second FET 24, the first FET 22 and the resistor 52 in sequence to the power supply terminal 54. While the voltage of the negative input of the amplifier 50 equals the preset positive voltage $V_{set}$, the first threshold voltage is obtained via getting the amplified voltage output by the amplifier 50 at this time and working out the absolute value of the difference between the amplified voltage and the preset positive voltage $V_{set}$ as the first threshold voltage.

Figure 5:
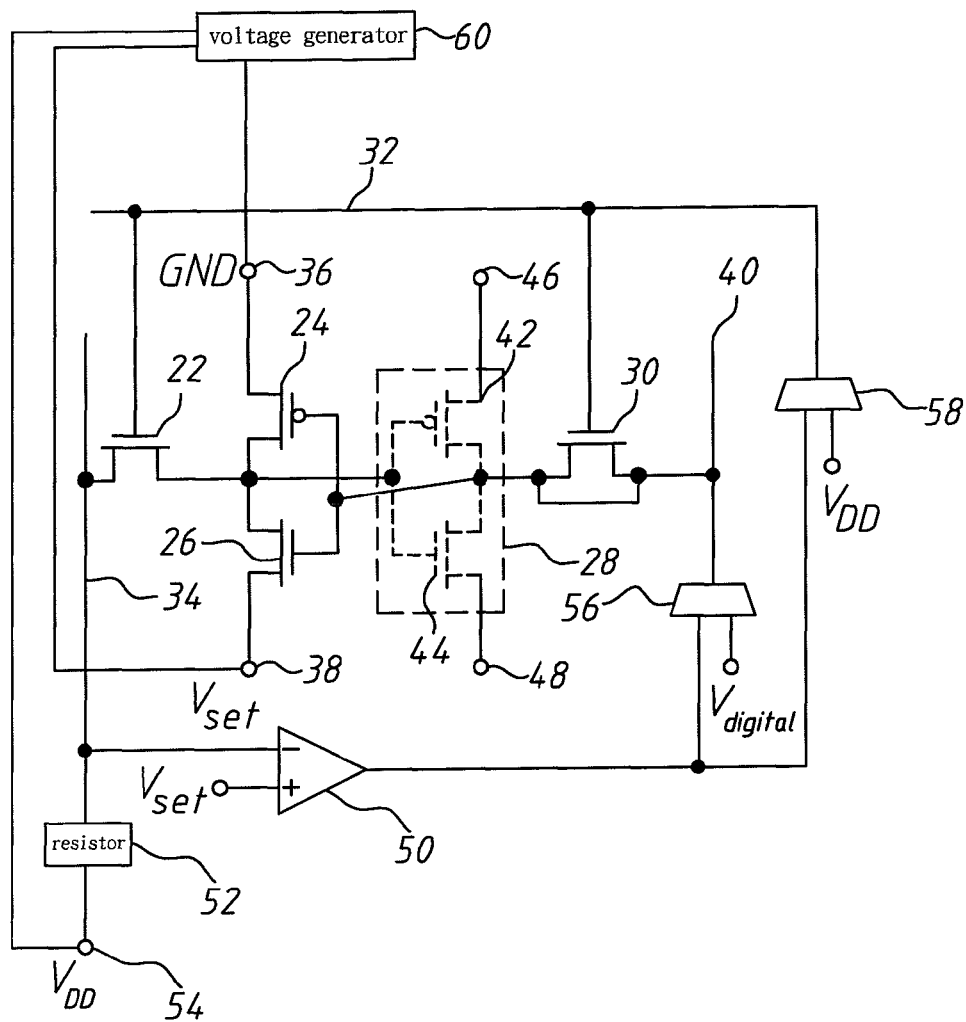
FIG. 5 schematically shows the circuit of a threshold voltage measure device for measuring the threshold voltage of a second FET according to one embodiment of the present invention.

Refer to FIG. 5, wherein the fifth and sixth FETs 42 and 44, which are drawn with dotted lines, do not operate because they are in a floating state. In the second operation mode, the voltage generator 60 respectively applies a third low voltage GND and the preset positive voltage $V_{set}$ to the first and second power terminals 36 and 38. The first voltage selector 56 selects to apply the amplified voltage to the second bit line 40; the second voltage selector 58 selects to apply the first high voltage $V_{DD}$ to the word line 32. The voltage generator 60 applies a fourth high voltage $V_{DD}$ to the power supply terminal 54 to let the current value of the resistor 52 under the voltage drop between the fourth high voltage $V_{DD}$ and the preset positive voltage $V_{set}$ equal the current value of the second FET 24 when a second gate-source voltage $V_{GS2}$ of the second FET 24 equals a second threshold voltage of the second FET 24, whereby a second current flows out from the power supply terminal 54 and passes through the resistor 52, the first FET 22 and the second FET 24 in sequence to the second power terminal 36. While the voltage of the negative input of the amplifier 50 equals the preset positive voltage $V_{set}$, the second threshold voltage is obtained via getting the amplified voltage output by the amplifier 50 at this time and working out the absolute value of the difference between the amplified voltage and the preset positive voltage $V_{set}$ as the second threshold voltage.

Figure 6:
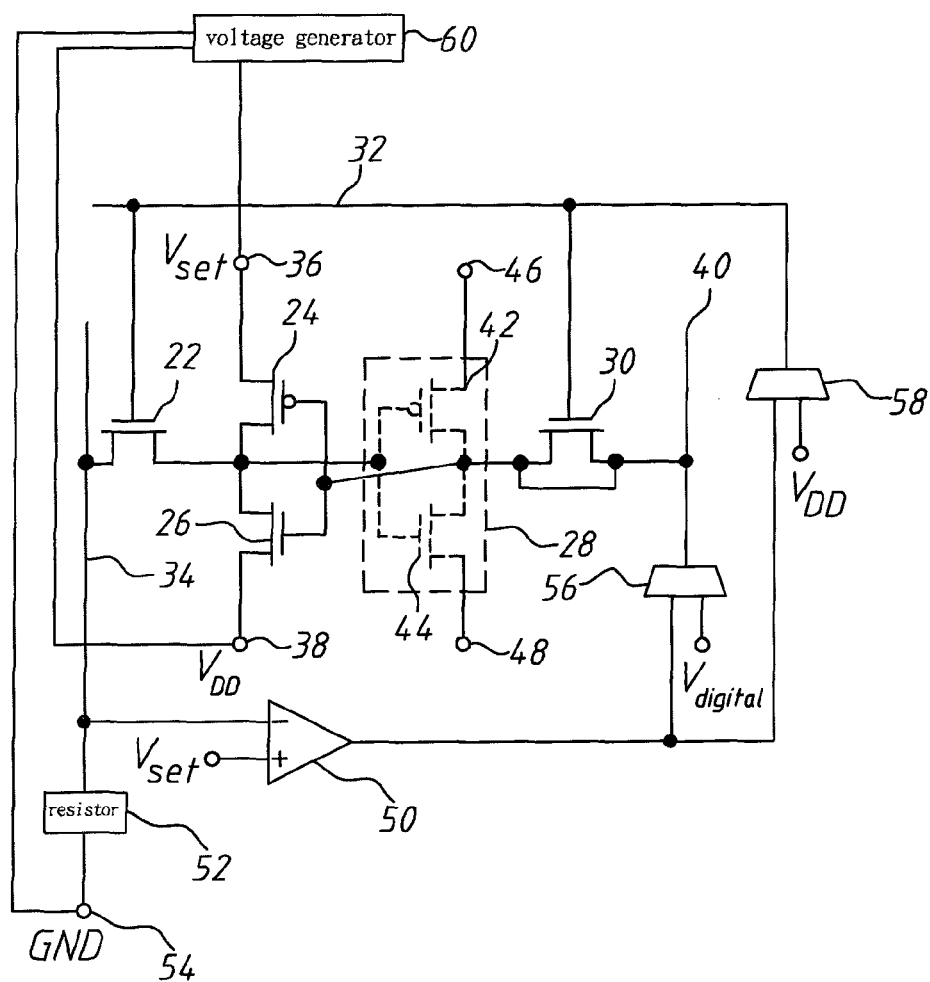
FIG. 6 schematically shows the circuit of a threshold voltage measure device for measuring the threshold voltage of a third FET according to one embodiment of the present invention.

Refer to FIG. 6, wherein the fifth and sixth FETs 42 and 44, which are drawn with dotted lines, do not operate because they are in a floating state. In the third operation mode, the voltage generator 60 respectively applies the preset positive voltage $V_{set}$ and a third high voltage $V_{DD}$ to the first and second power terminals 36 and 38. The first voltage selector 56 selects to apply the amplified voltage to the second bit line 40; the second voltage selector 58 selects to apply the first high voltage $V_{DD}$ to the word line 32. The voltage generator 60 applies a second low voltage GND to the power supply terminal 54 to let the current value of the resistor 52 under the voltage drop between the second low voltage GND and the preset positive voltage $V_{set}$ equal the current value of the third FET 26 when a third gate-source voltage $V_{GS3}$ of the third FET 26 equals a third threshold voltage of the third FET 26, whereby a third current flows out from the second power terminal 38 and passes through the third FET 26, the first FET 22 and the resistor 52 in sequence to the power supply terminal 54. While the voltage of the negative input of the amplifier 50 equals the preset positive voltage $V_{set}$, the third threshold voltage is obtained via getting the amplified voltage output by the amplifier 50 at this time and working out the absolute value of the difference between the amplified voltage and the preset positive voltage $V_{set}$ as the third threshold voltage.

The threshold voltages can be converted into frequency signals via a dual-VCO (Voltage Controlled Oscillator) type AD converter. The frequency signals are further converted into full-digital binary numbers, which are convenient for retrieving, processing and analyzing. In other words, the present invention can merely use a single circuit structure to obtain the threshold voltages of three transistors, accelerating the measurement and reducing the costs of fabrication and measurement.

Further, the present invention can also apply to the BTI technology to measure the threshold voltage of the SRAM stressed by bias and temperature. Refer to FIG. 3. While the first FET 22 is to be stressed, an intense voltage $V_{stress}$ is applied to the word line 32 with all the voltages of the first power terminal 36, the second power terminal 38, the first bit line 34 and the second bit line 40 being neglected. While the second FET 24 or the third FET 26 is to be stressed, a high voltage $V_{DD}$ and a low voltage GND are respectively applied to the first power terminal 36 and the second power terminal 38, and an intense voltage $V_{stress}$ is applied to the second bit line 40 with the voltages of the word line 32 and the first bit line 34 being neglected.

In conclusion, the present invention not only can fast obtain the threshold voltages of the FETs of SRAM but also can apply to the BTI technology. Compared with the conventional technology, the present invention can effectively shorten the time for measurement and greatly reduce the costs of fabrication and measurement.

The embodiments described above are only to exemplify the present invention but not to limit the scope of the present invention. Any equivalent modification or variation according to the structure, characteristic or spirit of the present invention is to be also included within the scope of the present invention.

What is claimed is:

1. A threshold voltage measurement device, which is connected with a 6T-SRAM (Static Random Access Memory) that comprises a first FET (Field Effect Transistor), a second FET, a third FET, an inverter, and a fourth FET, wherein said first FET connects with a first bit line and a word line, and wherein said second FET and said third FET respectively have a first power terminal and a second power terminal, and wherein a third power terminal and a fourth power terminal of said inverter are in a floating state, and wherein said fourth FET connects with a second bit line and said word line, and wherein a drain and a source of said fourth FET are short-circuited, and wherein said threshold voltage measurement device comprises an amplifier outputting an amplified voltage, wherein a negative input of said amplifier connects with said first bit line and connects with a power supply terminal via a resistor, and wherein a positive input of said amplifier connects with a preset positive voltage;

a first voltage selector receiving a digital voltage, connecting with said amplifier and said second bit line, and selecting to apply said digital voltage or said amplified voltage to said second bit line; and a second voltage selector receiving a first high voltage, connecting with said amplifier and said word line, and selecting to apply said first high voltage or said amplified voltage to said word line, wherein said threshold voltage measurement device operates to meet requirements of different measurements respectively according to a first operation mode, a second operation mode and a third operation mode, wherein in said first operation mode, a second high voltage is applied to said first power terminal and said second power terminal; said first voltage selector selects to apply said digital voltage to said second bit line; said second voltage selector selects to apply said amplified voltage to said word line; a first low voltage is applied to said power supply terminal to let a current value of said resistor under a voltage drop between said first low voltage and said preset positive voltage equal a current value of said first FET when a first gate-source voltage ($V_{GS1}$) of said first FET equals a first threshold voltage of said first FET, whereby a first current flows out from said first power terminal or said second power terminal and passes through said first FET and said resistor in sequence to said power supply terminal; while a voltage of said negative input equals said preset positive voltage, said first threshold voltage is obtained via said amplified voltage, and wherein in said second operation mode, a third low voltage and said preset positive voltage are respectively applied to said first power terminal and said second power terminal; said first voltage selector selects to apply said amplified voltage to said second bit line; said second voltage selector selects to apply said first high voltage to the word line; a fourth high voltage is applied to said power supply terminal to let a current value of said resistor under a voltage drop between said fourth high voltage and said preset positive voltage equal a current value of said second FET when a second gate-source voltage ($V_{GS2}$) of said second FET equals a second threshold voltage of said second FET, whereby a second current flows out from said power supply terminal and passes through said resistor, said first FET and said second FET in sequence to said first power terminal; while a voltage of said negative input equals said preset positive voltage, said second threshold voltage is obtained via said amplified voltage, and wherein in said third operation mode, said preset positive voltage and a third high voltage are respectively applied to said first power terminal and said second power terminal; said first voltage selector selects to apply said amplified voltage to said second bit line; said second voltage selector selects to apply said first high voltage to said word line; a second low voltage is applied to said power supply terminal to let a current value of said resistor under a voltage drop between said second low voltage and said preset positive voltage equal a current value of said third FET when a third gate-source voltage ($V_{GS3}$) of said third FET equals a third threshold voltage of said third FET, whereby a third current flows out from said second power terminal and passes through said third FET, said first FET and said resistor in sequence to said power supply terminal; while a voltage of said negative input equals said preset positive voltage, said third threshold voltage is obtained via said amplified voltage.

2. The threshold voltage measurement device according to claim 1, wherein in said first operation mode, said first threshold voltage equals an absolute value of a difference between said amplified value and said preset positive voltage.

3. The threshold voltage measurement device according to claim 1, wherein in said second operation mode, said second threshold voltage equals an absolute value of a difference between said amplified value and said preset positive voltage.

4. The threshold voltage measurement device according to claim 1, wherein in said third operation mode, said third threshold voltage equals an absolute value of a difference between said amplified value and said preset positive voltage.

5. The threshold voltage measurement device according to claim 1, wherein when said digital voltage is a high level voltage, said first current flows out from said second power terminal.

6. The threshold voltage measurement device according to claim 1, wherein when said digital voltage is a low level voltage, said first current flows out from said first power terminal.

7. The threshold voltage measurement device according to claim 1, wherein a gate of said first FET connects with said word line, and wherein a drain of said first FET connects with first bit line, and wherein a drain of said second FET functions as said first power terminal, and wherein a source of said second FET connects with a source of said first FET, and wherein a drain of said third FET functions as said second power terminal, and wherein a source of said third FET connects with said source of said first FET and said inverter, and wherein a gate of said third FET connects with a gate of said second FET, said inverter, and a source of said fourth FET, and wherein a gate and a drain of said fourth FET respectively connects with said word line and said second bit line.

8. The threshold voltage measurement device according to claim 1, wherein said inverter includes
   a fifth FET, wherein a drain of said fifth FET functions as said third power terminal; and
   a sixth FET, wherein a drain of said sixth FET functions as said fourth power terminal, and wherein a source of said sixth FET connects with a source of said fourth FET and gates of said second FET and said third FET, and wherein a gate of said sixth FET connects with a gate of said fifth FET and sources of said first FET, said second FET and said third FET.

9. The threshold voltage measurement device according to claim 8, wherein said fifth FET and said sixth FET are respectively a P-channel FET and an N-channel FET.

10. The threshold voltage measurement device according to claim 1, wherein said first FET, said third FET and said fourth FET are N-channel FETs, and wherein said second FET is a P-channel FET.

* * * * *